United States Patent [19]
Han et al.

[11] Patent Number: 5,784,322
[45] Date of Patent: Jul. 21, 1998

[54] STANDBY CURRENT DETECTING CIRCUIT FOR USE IN A SEMICONDUCTOR MEMORY DEVICE AND METHOD THEREOF

[75] Inventors: Jin-Man Han, Seoul; Jei-Hwan Yoo, Suwon, both of Rep. of Korea

[73] Assignee: Samsung Electronics, Co., Ltd., Suwon, Rep. of Korea

[21] Appl. No.: 772,356

[22] Filed: Dec. 23, 1996

[30] Foreign Application Priority Data

Dec. 21, 1995 [KR] Rep. of Korea ............... 53539/1995

[51] Int. Cl.⁶ .................................................. G11C 7/00
[52] U.S. Cl. ..................... 365/201; 365/227; 365/230.06
[58] Field of Search ........................ 365/96, 226, 201, 365/200, 230.06, 227

[56] References Cited

U.S. PATENT DOCUMENTS 5,295,112  3/1994  Taniguchi .................... 365/227
5,313,430  5/1994  Rawlins ....................... 365/200

*Primary Examiner*—A. Zarabian
*Attorney, Agent, or Firm*—Marger, Johnson, McCollom, & Stolowitz P.C.

[57] ABSTRACT

A standby current detecting circuit for use in a semiconductor memory device and method thereof are described. The memory device has a plurality of memory cells arranged at crossing points of a plurality of word lines and a plurality of bit lines. A plurality of switches are associated with each memory cell. A current path supplies current to each memory cell through the switch associated with each memory cell. A plurality of decoders are provided with each decoder for detecting a standby current supplied on one such current path for the memory cell. Each decoder includes control logic for selectively opening and isolating the switch associated with the memory cell in a standby current detection mode.

22 Claims, 4 Drawing Sheets

| STEP | XA0 | XA0B | XA1 | XA1B | YA0 | YA0B | YA1 | YA1B |
|------|-----|------|-----|------|-----|------|-----|------|
| 1 | | | H | L | | | | |
| 2 | | | H | L | | | H | L |
| 3 | L | H | H | L | | | H | L |
| 4 | L | H | H | L | L | H | H | L |

STANDBY CURRENT DETECTING CIRCUIT FOR USE IN A SEMICONDUCTOR MEMORY DEVICE AND METHOD THEREOF

BACKGROUND OF THE INVENTION

The present invention relates to a semiconductor memory device, and more particularly, to a standby current detecting circuit for use in a semiconductor memory device and method thereof.

The integration level of semiconductor memory devices, such as dynamic random access memory (DRAM) devices, has been progressively increasing with advances in chip fabrication technology. In turn, higher integration has resulted in a corresponding decrease in individual element and interconnection pattern sizes. Consequently, more masks are required to fabricate each DRAM device.

Particulate contamination is one reason for low chip fabrication yields. For instance, particles might be inadvertently introduced during each mask processing step and can interfere with pattern formation. As more masks require more processing steps, there are increased chances of particulate contamination occurring with a resultant lower yield.

Moreover, incorrect pattern formation due to particulate contamination can cause a malfunction in the operation of DRAM devices, such as an increase in the current required to operate the chip. For example, if a contaminant particle is accidentally deposited on the chip substrate between the masking steps for forming individual memory cells, the information stored in the affected cells of the resulting DRAM device will be incorrect.

However, this type of memory cell failure can be remedied by replacing the failed cells with redundant cells in the DRAM device. In the case of failed cells which generate excess current, a technique for isolating the current generation as well as replacing the failed cells with redundant cells must be utilized. This technique can also be used for situations in which the particles effect other circuits or signal lines to cause a short circuit. For these types of problems, the failure can be repaired by isolating the current generation path and replacing the failed circuits or signal lines with spare circuits or signal lines.

A standby current poses a different problem. When a DRAM device is in a standby state, a standby current is applied to maintain the stored state of the chip. If a short circuit due to particulate contamination cannot be isolated and fixed, it can become virtually impossible to detect and suppress the standby current once it falls below a measurable current threshold. Moreover, the techniques used for isolating excess current can only be used to detect the presence of the standby current and are unable to detect where within the chip the standby current causing the short circuit is generated.

SUMMARY OF THE INVENTION

Therefore, it is an object of the present invention to provide a standby current detecting circuit and method for detecting where within a semiconductor memory device a short circuit is generated.

An embodiment of the present invention is a standby current detecting circuit for use in a semiconductor memory device. The memory device comprises a plurality of memory cells arranged at crossing points of a plurality of word lines and a plurality of bit lines. A plurality of switches are associated with each memory cell. A current path supplies current to each memory cell through the switch associated with each memory cell. A plurality of decoders are provided with each decoder for detecting a standby current supplied on one such current path for the memory cell. Each decoder includes control logic for selectively opening and isolating the switch associated with the memory cell in a standby current detection mode.

A further embodiment of the present invention is a method for locating a malfunctioning memory cell in a semiconductor memory device. The memory device comprises a plurality of the memory cells and a plurality of decoders. Each memory cell comprises a switch for isolating an associated current path to the memory cell. Each decoder is associated with one such memory cell and includes a detector for detecting a standby current supplied on one such current path for the memory cell. A fraction of the memory cells in the memory device are selected. The current path to each of the memory cells in the fraction of the memory cells selected is opened. The standby current flowing into the fraction of the memory cells with open current paths is sensed. A further fraction of the memory cells in the memory device not selected in the set of selecting is chosen if the standby current is not sensed as flowing into the fraction of the memory cells. The steps of selecting, opening, sensing and choosing are repeated using the fraction of the memory cells or the further fraction of the memory cells into which the standby current is sensed as flowing into until a single memory cell is selected.

The foregoing and other objects, features and advantages of the invention will become more readily apparent from the following detailed description of a preferred embodiment of the invention which proceeds with reference to the accompanying drawings.

DETAILED DESCRIPTION

Figure 1:
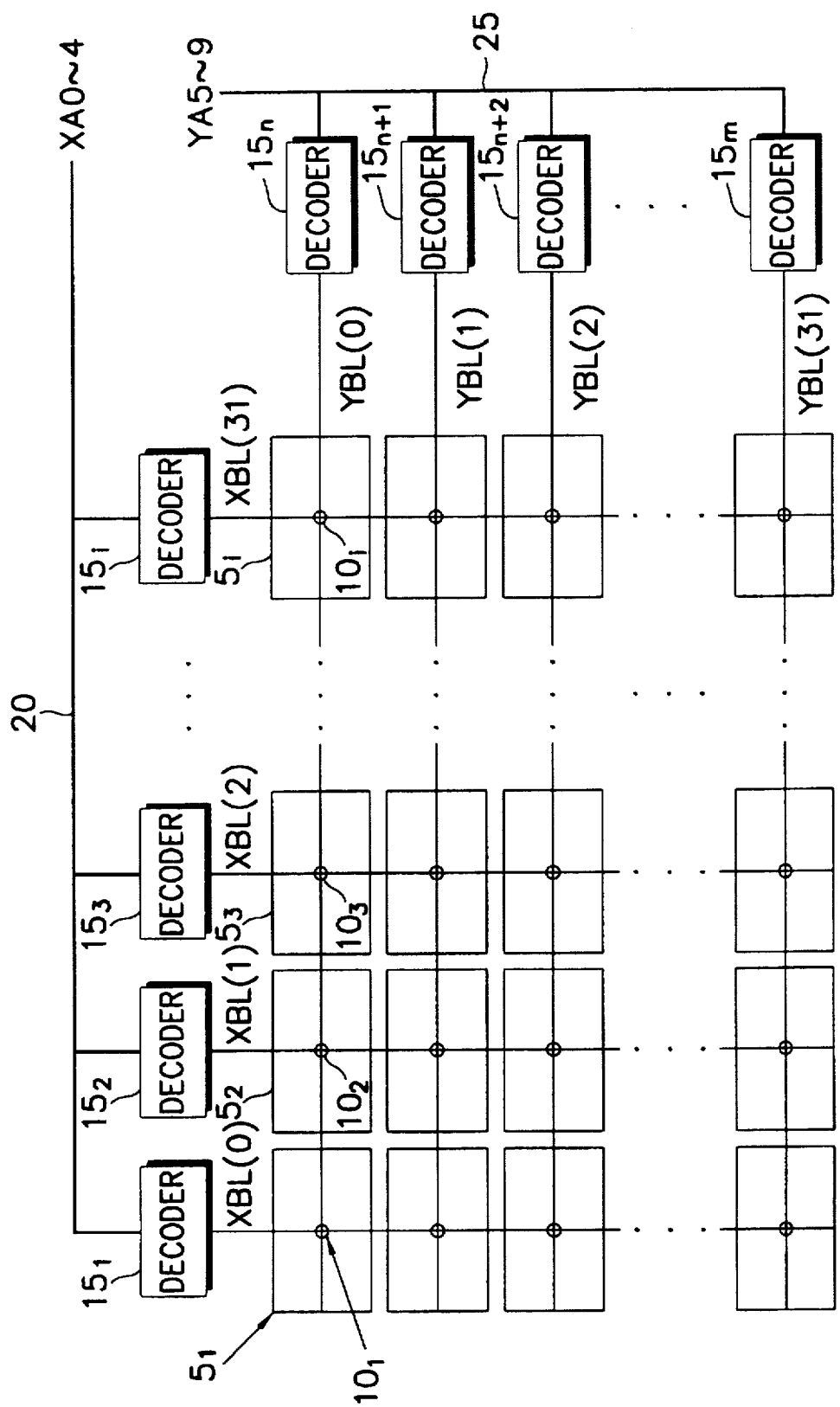
FIG. 1 shows a schematic block diagram of a standby current detecting circuit for a semiconductor memory device according to the present invention.
Figure 2A:
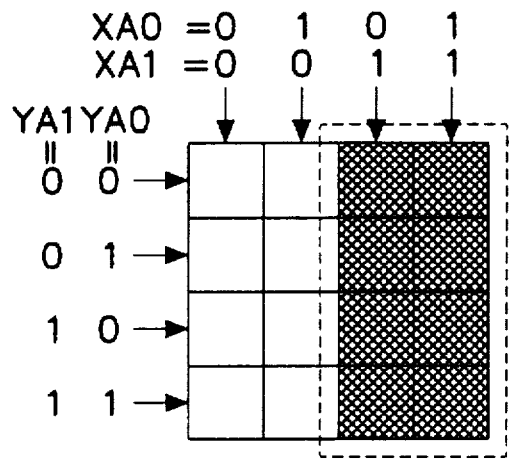
FIG. 2 shows a diagram of a method for locating a malfunctioning memory cell mat in a semiconductor memory device according to the present invention.
Figure 2B:
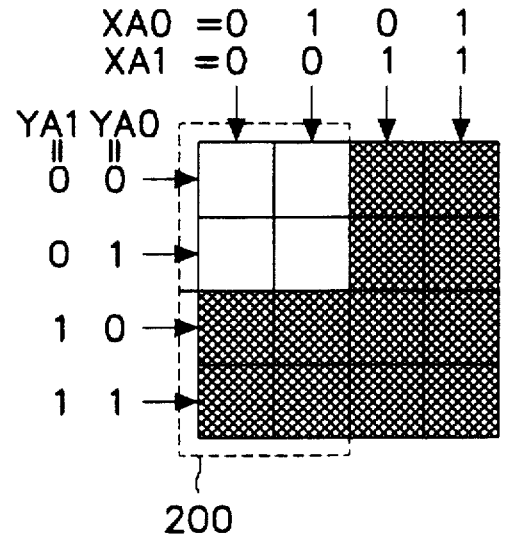
Figure 2D:
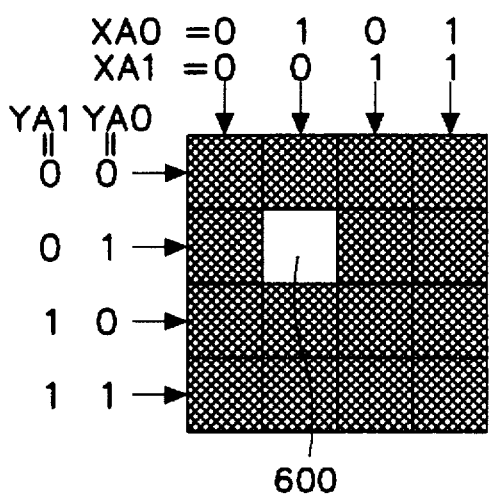
Figure 2C:
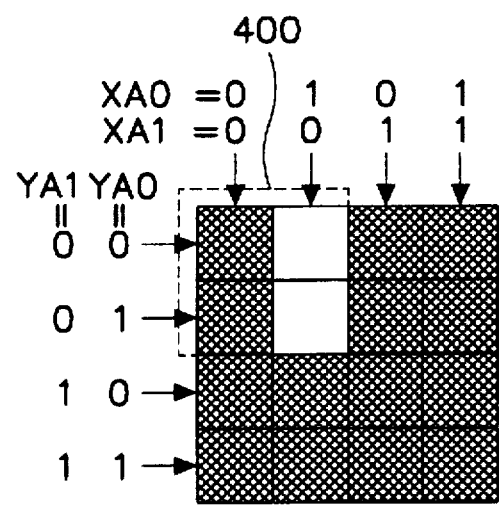

FIG. 1 shows a schematic block diagram of a standby current detecting circuit for a semiconductor memory device according to the present invention. The memory cell array includes a plurality of memory cell mats $5_1$ to $5_i$, where i is an integer number, for storing and reading out data values. Hereinafter mats $5_1$ to $5_i$ will be referred to as mats 5. The mats 5 are arranged at crossing points of a plurality of word lines XBL(i) and a plurality of bit lines YBL(i), where i corresponds to the line number. The memory cell array also includes a plurality of switches $10_1$ to $10_i$, where i is an integer number. Hereinafter each of switches $10_1$ to $10_i$ will be referred to as a switch 10. Each mat 5 has a switch 10 for isolating an associated current path. The memory cell array also has a plurality of decoders $15_1$ to $15_i$, where i is an integer number, for decoding row addresses XA0 to XA4 applied via signal wire 20 and a plurality of decoders $15_n$ to $15_m$, where in and m are an integer numbers, for decoding column addresses YA5 to YA9 applied via signal wire 25. Hereinafter decoders $15_i$ to $15_j$ and decoders $15_n$ to $15_m$ will be referred to as decoders 15.

Each switch 10 is controlled by an external control signal (not shown) for placing the switch 10 into an on or off state. Ordinarily, when the switch 10 is turned on, the switch 10 is placed into an open condition and the associated current path to the mat 5 is interrupted.

Thus, no current flows to the mat 5. When the mat 5 is placed in a standby state, the switch 10 applies a logic "high" or "low" voltage to a pad (not shown) interconnected with the memory device for controlling the operation of the state of the addresses. If the standby current flowing to the memory device decreases when the current path to a specific mat 5 is opened during testing, the standby current consumed can be attributed to that mat 5.

This testing operation can be performed on each of the mats 5 for ascertaining the standby current consumption for all mats 5 on the memory device. However, the operation is limited to testing only one mat 5 at a time. The amount of testing time required, and therefore, the testing costs increase with the number of mats 5 on the memory device. For instance, for a memory device having a memory cell array having n row addresses and m column addresses, $2^n \times 2^m$ mats 5 must be sequentially tested. Therefore, selecting and simultaneously controlling a plurality of mats 5, rather than one mat 5 at a time, would shorten the time required for locating a mat 5 on a memory device to which the standby current flows abnormally.

FIG. 2 shows a diagram of a method for locating a malfunctioning memory cell mat in a semiconductor memory device according to the present invention. The method comprises a series of steps carried out in successive refinement until the malfunctioning mat 5 is found. Rather than scanning each mat 5 in the memory device, a binary search which progressively focuses on smaller and smaller sections of the memory cell array is carried out, although other similar non-exhaustive searching techniques are suitable.

As illustrated in FIG. 2, the method is applied, by way of illustration, to searching a 4×4 array of the memory cell mats 5 of FIG. 1 with each successive step of the method shown in a clockwise fashion beginning from the upper left. Generally, it is impractical to exhaustively scan all mats 5 to detect where the failure occurred within the chip. Instead, half of the chip is initially selected and searched, followed by half of the half, and so on, until only a single mat 5 remains which, by process of elimination, must be the defective mat 5. For a single failed mat 5, the present search method will locate the failed mat 5 in $\log_2 n$ steps, where n is the total number of memory cell mats 5. For example, in a memory device having 1024 mats 5, the search can locate the failed mat 5 in $\log_2 1024 = 10$ steps, rather than the 1024 steps required by an exhaustive search.

Thus, to efficiently detect a malfunctioning mat 5 within the memory device to which an abnormal standby current flows, half of the memory array 100 is first selected and the current paths for each of the mats 5 within the selected half 100 are opened using their associated switch 10 (shown in FIG. 1). The selected mats 5 are addressed using their row addresses XA0, XA1 and column addresses YA0, YA1. The standby current flowing to the memory device is sensed and the half of the memory array 200 to which the standby current decreases is selected as including the malfunctioning mat 5. The unselected half is eliminated from further consideration. Next, half of the selected half, that is, a quarter, of the memory array is selected, the current paths for each of the mats 5 within the selected quarter are opened and the standby current flow sensed in the same manner as performed above. This sequence is repeated for the selected quarter of the memory array 400 and so on until the malfunctioning mat 600 is located.

Figures 3, 4:
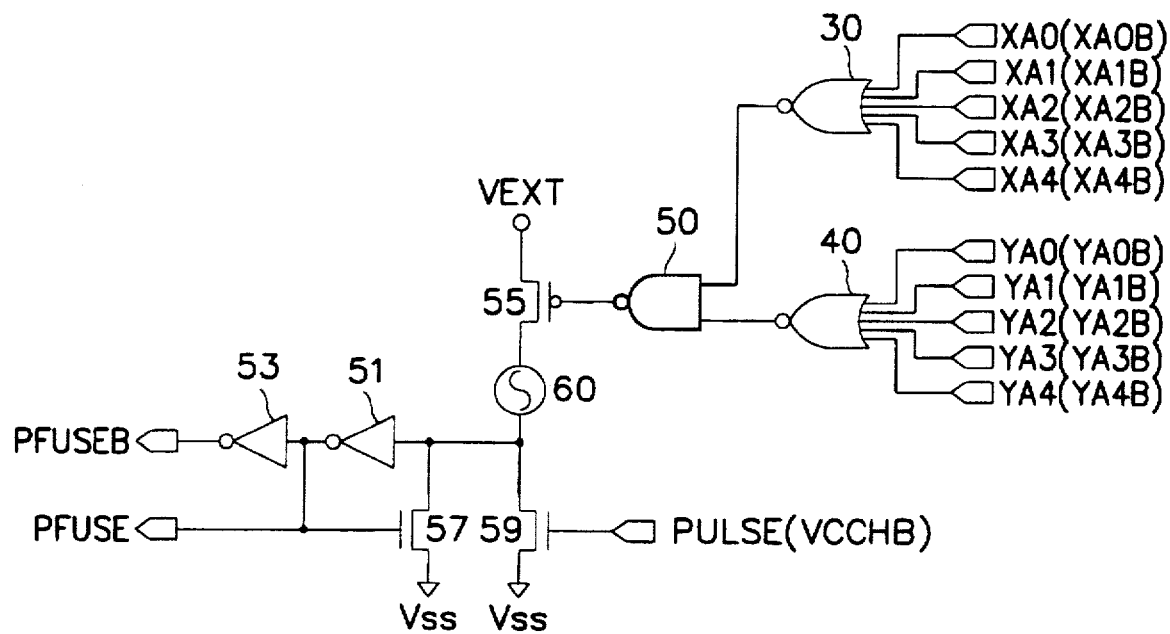
FIG. 3 shows a schematic diagram of a decoder for use in the standby current detecting circuit of FIG. 1.
FIG. 4 shows, by way of example, a table of the logic states of the row and column addresses for the standby current detecting circuit of FIG. 1.

FIG. 3 shows a schematic diagram of a decoder 15 for use in the standby current detecting circuit of FIG. 1. The decoder 15 includes a NOR gate 30 for receiving row addresses XA0-4 and a NOR gate 40 for receiving column addresses YA0-4. As shown, the inverted values of the respective row and column addresses are indicated parenthetically, for instance, XA0B corresponds to inverted XA0. A NAND gate 50 receives the outputs of NOR gates 30 and 40. The gate of a PMOS transistor 55 receives the output of NAND gate 50 which is switched to a power bus 60 fed from an external voltage source VEXT. Inverters 51 and 53 and NMOS transistors 57 and 59 receive the output from the power bus 60 by which power is applied to the associated mat 5 (shown in FIG. 1). A pulse signal PULSE is also received by the decoder 15. NMOS transistors 57 and 59 both feed to ground as indicated by $V_{SS}$. Output signals PFUSE and PFUSEB from the decoder 15 serve to open and short circuit the current path to the associated mat 5. If transistors 57 and 59 are in an off state, the power is not supplied to the mat 5 and the mat 5 will not generate a standby current. To select a specific decoder 15 for testing, the proper combination of row and column addresses for the specific mat 5 being tested must be able supplied as inputs to the NOR gates 30 and 40 so transistors 57 and 59 will be in an on state.

Figure 5:
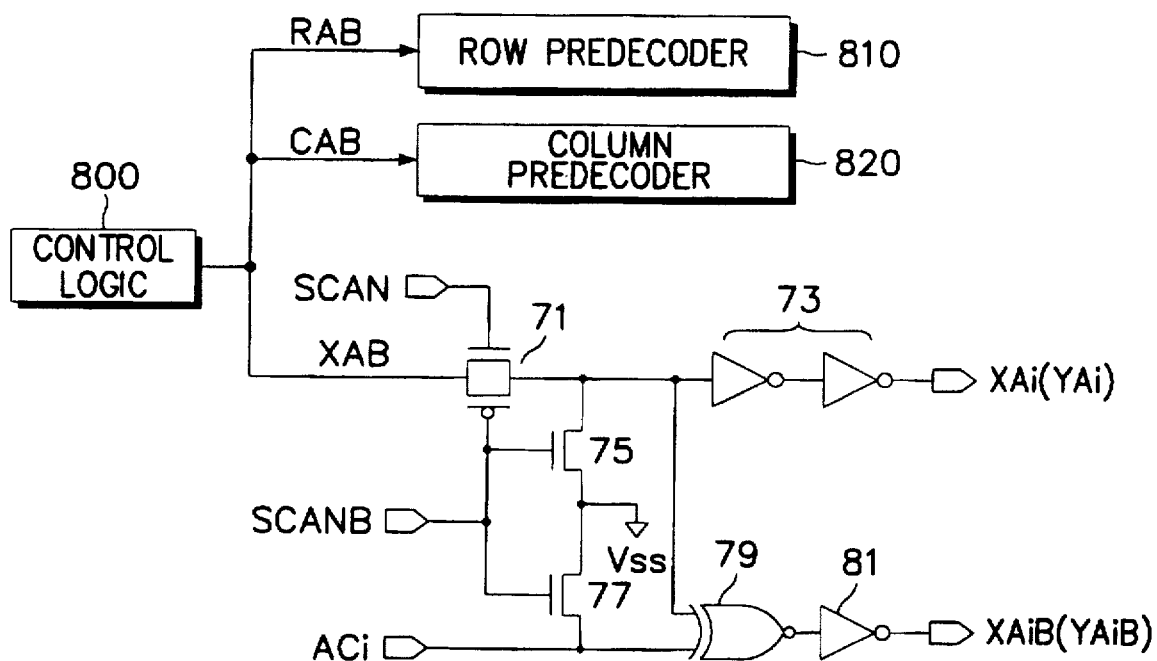
FIG. 5 shows a schematic diagram of an address buffer for use in the standby current detecting circuit of FIG. 1.

FIG. 4 shows, by way of example, a table of the logic states of row addresses XA0-1 and XA0-1B and column addresses YA0-1 and YA0-1B for a portion of the standby current detecting circuit of FIG. 1. The logic states for the full standby current detecting circuit can be determined by extension. An address buffer described below with reference to FIG. 5 is used to generate these logic states. The logic states are supplied as inputs to the decoder 15 (shown in FIG. 3) for causing an opening or closing of the switches 10 for each of the mats 5.

FIG. 5 shows a schematic diagram of an address buffer for use in the standby current detecting circuit of FIG. 1. Externally-supplied master signals SCAN and SCANB place the address buffer into a standby current detecting mode. An externally-supplied address signal ACi controls the output states of the output row and address signals, which are split into separate row address signals XAi and XAiB and the column address signals YAi and YAiB. Control logic 800 supplies signals RAB, CAB and XAB to row predecoder 810, column predecoder 820 and transmission gate 71, respectively. The SCAN and SCANB master signals are gated by the transmission gate 71 whose output is received by inverters 73 and an XNOR gate 79. The output of XNOR gate 79 is received by inverter 81. The SCANB master signal is also received by NMOS transistors 75 and 77 which feed to ground $V_{SS}$. In a normal, non-standby state, the state of the row (or column) address signal XAiB (YAib) is opposite that of the row (or column) address signal XAi (YAi). However, if the ACi signal is supplied as a logic "low" level, the states of the row address signals XAiB and XAi become identical to each other, whereas if the ACi signal is supplied as a logic "high" level, the address buffer goes into the standby current detecting mode.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A standby current detecting circuit for use in a semiconductor memory device, the memory device comprising a plurality of memory cells arranged at crossing points of a plurality of word lines and a plurality of bit lines, comprising:
   a plurality of switches associated with each memory cell;
   a current path supplying current to each memory cell through the switch associated with each memory cell; and
   a plurality of decoders, each decoder for detecting a standby current supplied on one such current path for the memory cell, each decoder including means for selectively opening and isolating the switch associated with the memory cell in a standby current detection mode.

2. A standby current detecting circuit according to claim 1, wherein each decoder further comprises:
   means for receiving a memory address comprising a row address and a column address; and
   means for selectively supplying current to the memory mat over the current path.

3. A standby current detecting circuit according to claim 2, wherein the receiving means further comprises:
   a nor gate for receiving the row address; and
   a nor gate for receiving the column address.

4. A standby current detecting circuit according to claim 1, further comprising:
   a plurality of address buffers, each address buffer interconnected with one of said plurality of decoders, the decoder receiving a memory address from the address buffer identifying the memory cell in the standby current detection mode.

5. A standby current detecting circuit for use in a semiconductor memory device, the memory device comprising a plurality of memory cells arranged at crossing points of a plurality of word lines and a plurality of bit lines, comprising:
   a plurality of switches associated with each memory cell;
   a current path supplying current to each memory cell through the switch associated with each memory cell;
   a plurality of decoders, each decoder for detecting a standby current supplied on one such current path for the memory cell, each decoder including means for selectively opening and isolating the switch associated with the memory cell in a standby current detection mode; and
   a plurality of address buffers, each address buffer interconnected with one of said plurality of decoders, the decoder receiving a memory address from the address buffer identifying the memory cell in the standby current detection mode, wherein each address buffer further comprises logic means for supplying a memory address signal, means for splitting the memory address signal into separate signals, and means for controlling a logic state of each split memory address signal.

6. A standby current detecting circuit according to claim 5, wherein the splitting means further comprises:
   a first set of logic gates for asserting a first logic level in a normal state; and
   a second set of logic gates for asserting a second logic level opposite from the first logic level in a normal state.

7. A standby current detecting circuit according to claim 6, wherein the first set of logic gates comprises a pair of inverters and the second set of logic gates comprises an XNOR gate and an inverter.

8. A standby current detecting circuit according to claim 5, wherein the means for controlling comprises:
   a transmission gate responsive to a pair of master signals, the master signals being supplied from a source external to the memory device.

9. A method for locating a malfunctioning memory cell in a semiconductor memory device, the memory device comprising a plurality of the memory cells and a plurality of decoders, each memory cell comprising a switch for isolating an associated current path to the memory cell, each decoder associated with one such memory cell and including means for detecting a standby current supplied on one such current path for the memory cell, the method comprising the steps of:
   selecting a fraction of the memory cells in the memory device;
   opening the current path to each of the memory cells in the fraction of the memory cells selected;
   sensing the standby current flowing into the fraction of the memory cells with open current paths;
   choosing a further fraction of the memory cells in the memory device not selected in the set of selecting if the standby current is not sensed as flowing into the fraction of the memory cells; and
   repeating the steps of selecting, opening, sensing and choosing using the fraction of the memory cells or the further fraction of the memory cells into which the standby current is sensed as flowing into until a single memory cell is selected.

10. A method according to claim 9, wherein the fraction comprises substantially half of the memory cells in the memory device, the step of selecting further comprising selecting half of the memory cells in the memory device and the step of choosing further comprising choosing substantially half of the fraction of the memory cells.

11. A method according to claim 10, further comprising performing a binary search of the memory cells in the memory device.

12. A standby current detecting circuit for use in a semiconductor memory device, the memory device comprising a plurality of memory cells arranged at crossing points of a plurality of word lines and a plurality of bit lines, comprising:
   a plurality of switches, each switch of said plurality associated with a corresponding memory cell;
   a current path supplying current to each memory cell through the switch associated with each memory cell; and
   a plurality of decoders, each decoder for detecting a standby current supplied on one such current path for the memory cell, each decoder including means for selectively opening and isolating the switch associated with the memory cell in a standby current detection mode, means for receiving a memory address comprising a row address and a column address, and means for selectively supplying current to the memory cell over the current path, the current supplying means further comprising means for detecting a combination of the row address and the column address corresponding to the memory cell, means for interfacing to the current path, the memory cell generating the standby current if power to the memory cell is turned off by the interfacing means, and means responsive to the detecting means for indicating to the interfacing means to turn the power to the memory cell off.

13. A standby current detecting circuit according to claim 12, wherein the detecting means is a NAND gate.

14. A standby current detecting circuit according to claim 12, wherein the interfacing means further comprises:

a power bus controlled by the detecting means; and a plurality of means responsive to the power bus for asserting output signals to the current path.

15. A standby current detecting circuit according to claim 14, wherein the means responsive to the power bus further comprises a plurality of NMOS transistors.

16. A standby current detecting circuit according to claim 15, further comprising a pair of inverters associated with an output signal.

17. A standby current detecting circuit according to claim 12, wherein the means responsive to the detecting means further comprises a PMOS transistor.

18. A standby current detecting circuit according to claim 12, further comprising:

a plurality of address buffers, each address buffer interconnected with one of said plurality of decoders, the decoder receiving a memory address from the address buffer identifying the memory cell in the standby current detection mode.

19. A standby current detecting circuit according to claim 18, wherein each address buffer further comprises:

logic means for supplying a memory address signal;

means for splitting the memory address signal into separate signals; and means for controlling a logic state of each split memory address signal.

20. A standby current detecting circuit according to claim 19, wherein the splitting means further comprises:

a first set of logic gates for asserting a first logic level in a normal state; and a second set of logic gates for asserting a second logic level opposite from the first logic level in a normal state.

21. A standby current detecting circuit according to claim 20, wherein the first set of logic gates comprises a pair of inverters and the second set of logic gates comprises an XNOR gate and an inverter.

22. A standby current detecting circuit according to claim 19, wherein the means for controlling comprises:

a transmission gate responsive to a pair of master signals, the master signals being supplied from a source external to the memory device.

\* \* \* \* \*